United States Patent
Liu et al.

(10) Patent No.: US 10,056,313 B2
(45) Date of Patent: Aug. 21, 2018

(54) POWER MODULE OF SQUARE FLAT PIN-FREE PACKAGING STRUCTURE

(71) Applicant: SOUTHEAST UNIVERSITY, Nanjing (CN)

(72) Inventors: Siyang Liu, Nanjing (CN); Ning Wang, Nanjing (CN); Jiaxing Wei, Nanjing (CN); Chao Liu, Nanjing (CN); Weifeng Sun, Nanjing (CN); Shengli Lu, Nanjing (CN); Longxing Shi, Nanjing (CN)

(73) Assignee: SOUTHEAST UNIVERSITY, Nanjing (CN)

( * ) Notice: Subject to any disclaimer, the term of this patent is extended or adjusted under 35 U.S.C. 154(b) by 0 days.

(21) Appl. No.: 15/576,850

(22) PCT Filed: Jan. 29, 2016

(86) PCT No.: PCT/CN2016/072692
§ 371 (c)(1),
(2) Date: Nov. 27, 2017

(87) PCT Pub. No.: WO2017/012329
PCT Pub. Date: Jan. 26, 2017

(65) Prior Publication Data
US 2018/0174942 A1    Jun. 21, 2018

(30) Foreign Application Priority Data

Jul. 20, 2015 (CN) .......................... 2015 1 0427669

(51) Int. Cl.
*H01L 23/367* (2006.01)
*H01L 23/495* (2006.01)
(Continued)

(52) U.S. Cl.
CPC ...... *H01L 23/3675* (2013.01); *H01L 23/3121* (2013.01); *H01L 23/49537* (2013.01);
(Continued)

(58) Field of Classification Search
None
See application file for complete search history.

(56) References Cited

U.S. PATENT DOCUMENTS 5,966,291 A * 10/1999 Baumel ............. H05K 7/20927
165/80.3
6,819,095 B1 * 11/2004 Dubhashi ............. G01R 15/207
324/117 H
(Continued)

FOREIGN PATENT DOCUMENTS

CN      102569241 B     3/2015
CN      105118818 A     12/2015

*Primary Examiner* — Michael Lebentritt
*Assistant Examiner* — Jordan Klein
(74) *Attorney, Agent, or Firm* — Gokalp Bayramoglu

(57) ABSTRACT

A power module of a square flat pin-free packaging structure for suppressing the power module from being excessively high in local temperature. The power module includes an insulating resin, a driving chip, a plurality of power chips, and a plurality of metal electrode contacts. The driving chip, the power chips, and the metal electrode contacts are electrically connected through a metal lead according to a predetermined circuit. A plurality of metal heat dissipating disks used for heat dissipation of the power chips and a driving chip lead frame are disposed at the bottom of the insulating resin. A plurality of metal power chip lead frames are disposed on the metal heat dissipating disks, the power chips are disposed on the power chip lead frames, and the drain electrodes of the power chips are electrically connected to the metal heat dissipating disks.

2 Claims, 3 Drawing Sheets

(51) Int. Cl.
*H01L 23/31* (2006.01)
*H01L 25/16* (2006.01)
*H01L 25/18* (2006.01)
*H01L 23/00* (2006.01)

(52) U.S. Cl.
CPC .. *H01L 23/49541* (2013.01); *H01L 23/49568* (2013.01); *H01L 23/49575* (2013.01); *H01L 25/16* (2013.01); *H01L 25/18* (2013.01); H01L 24/32 (2013.01); H01L 24/48 (2013.01); H01L 24/73 (2013.01); H01L 2224/29139 (2013.01); H01L 2224/32245 (2013.01); H01L 2224/48091 (2013.01); H01L 2224/48106 (2013.01); H01L 2224/48175 (2013.01); H01L 2224/73265 (2013.01); H01L 2924/01079 (2013.01); H01L 2924/1306 (2013.01); H01L 2924/1426 (2013.01); H01L 2924/17738 (2013.01); H01L 2924/17747 (2013.01)

(56) References Cited

U.S. PATENT DOCUMENTS

| | | | | |
|---|---|---|---|---|
| 8,916,967 | B1* | 12/2014 | Yamashita | H02M 7/003 257/723 |
| 2003/0067749 | A1* | 4/2003 | Tamba | H05K 7/20927 361/699 |
| 2012/0168922 | A1* | 7/2012 | Cho | H01L 23/49524 257/676 |
| 2014/0097531 | A1* | 4/2014 | Fernando | H01L 23/49513 257/676 |
| 2014/0117517 | A1* | 5/2014 | Fernando | H01L 23/49575 257/666 |

* cited by examiner

US 10,056,313 B2

POWER MODULE OF SQUARE FLAT PIN-FREE PACKAGING STRUCTURE

CROSS-REFERENCE TO RELATED APPLICATION

This application is the national phase entry of International Application No. PCT/CN2016/072692, filed on Jan. 29, 2016, which is based upon and claims priority to Chinese Patent Application No. CN201510427669.3, filed on Jul. 20, 2015, the entire contents of which are incorporated herein by reference.

TECHNICAL FIELD

The invention relates to a power module of square flat pin-free packaging structure, and specifically relates to optimizing the height differences of the structural layers of the square flat pin-free packaging structure, so as to expedite the overall heat dissipation of the power module, inhibit excessive local heat build-up on the power module, suppress the aging of local devices and therefore extend the overall service life of the module.

BACKGROUND

With the continual miniaturization of the semiconductor power module, the process dimension for the packaging process of the semiconductor power module is constantly shrinking and the square flat pin-free packaging (a surface-mounted semiconductor packaging technique) of the power module emerges. The technique enables the circuit function at target size, which was only possible with multiple discrete packaged devices before. Furthermore, as far as the electric performance is concerned, it eliminates unnecessary resistors and inductors, thus enabling a device with higher power density than discrete devices with the same packaging size. The power modules packaged in this way are gaining more and more market shares thanks to their high reliability, small power loss, and low development cost.

For the power modules of the square flat pin-free packaging structure, since the heat loss of the power chips are much larger than that of the driving chip, if the same kind of heat dissipating means are used for both the driving chip and the power chips, the utilization of the packaging space would be hampered, and a local heat buildup may result, causing premature aging effect to some chips well within their service lives, thereby negatively impacting the reliability of the product, leading to a shortened service life or even malfunction.

In the inventive power module of the square flat pin-free packaging structure, metal supporting pillars are used to elevate the structural layer where the driving chip lead frame resides, the height of the structural layer where the power chips reside remains unchanged, and the power chip lead frames and the metal heat dissipating disks extend into the area below the driving chip lead frame, thereby increasing the area of the metal heat dissipating disks corresponding to the power chips, accelerating the heat dissipation of the power chips which have large thermal design power (TDP).

Meanwhile, since the copper lead frames and the metal heat dissipating disks corresponding to the power chips with large TDP expand in area, main heat dissipating paths for the power chips spread on a larger area, such that there is a more uniform temperature distribution on the packaged module, preventing the excessive local heat buildup on the module and improving the reliability of the product. Furthermore, Due to the optimization of the heights of various structural layers, there is a height difference between two ends of the metal electrode lead, which alleviates the gravity-induced collapse of the electrode lead, reducing the occurrence of short-circuits, the difficulty in processing and the manufacturing cost.

SUMMARY

The invention provides a power module of square flat pin-free packaging structure, which expedites the heat dissipation of the packaged module, ameliorates the drastic temperature difference between local areas and evens out the temperature distribution.

To do so, the invention provides the following technical solution:

A power module of a square flat pin-free packaging structure, comprising: insulating resin, a driving chip, power chips, and metal electrode contacts, the driving chip, the power chips, and the metal electrode contacts are electrically connected through a metal lead according to a specified design circuit, metal heat dissipating disks used for heat dissipation of the power chips and a driving chip lead frame are disposed at the bottom of the insulating resin, power chip lead frames are disposed on the metal heat dissipating disks, the power chips are disposed on the power chip lead frames, and the drain electrodes of the power chips are electrically connected to the metal heat dissipating disks, the driving chips are disposed on the driving chip lead frames, and the metal heat dissipating disks extend beyond the area occupied by the driving chip lead frame and the metal electrode contacts at the bottom layer to cover other bottom areas than those occupied by the driving chip lead frame and the metal electrode contacts, metal supporting pillars are disposed on the bottom layer below the driving chip lead frame and used to elevate the driving chip lead frame away from the bottom layer, and the metal heat dissipating disks further extend into the bottom layer area below the driving chip lead frame.

Compared with the prior art, this invention has the following advantages:

(1) In the square flat pin-free packaging structure of the power module according to this invention, the driving chip lead frame 3 is elevated to a height by four metal supporting pillars 4 at respective corners, portions of the power chip lead frames 2 and the corresponding metal heat dissipating disks 6 extend into the area below the driving chip lead frame 3, thereby increasing the area of the metal heat dissipating disks corresponding to the power chips 30 with large thermal design power (TDP), accelerating the overall heat dissipation of the packaged module; meanwhile, the metal heat dissipating disks 6 make more adequate use of the bottom area of the packaged module, such that more bottom areas of the packaging structure may be utilized for the heat dissipation of the module, avoiding drastic difference of local temperatures, suppressing the aging of local devices while expediting the heat dissipation, thereby extending the service life of the device. FIGS. 7 and 8 illustrate respectively the analysis of the heat dissipation of the power chips with identical power rating and of the inventive structure and the prior art structure respectively in the same environment. As shown in FIG. 7, the highest temperature of the inventive structure is 123.2° C. and the lowest temperature is 53.348° C., in contrast, as shown in FIG. 8, the highest temperature of the prior art structure is 131.8° C. and the lowest temperature is 43.796° C.; it's obvious the temperature differences between the areas of the module of the inventive structure as shown in FIG. 7 is smaller than those of the prior art module as shown in FIG. 8, the overall temperature distribution on the power module of the inventive structure tends to be more uniform, inhibiting excessive local heat build-up and the resultant accelerated aging of devices, therefore extending the overall service life of the power module. As for the high temperature areas of the module shown in FIGS. 7 and 8, the temperature of module of the inventive structure shown in 7 is lower than that of the power module shown in FIG. 8, as a result, the dissipation efficiency of the inventive module shown in FIG. 7 is superior to that of the power module shown in FIG. 8.

(2) In the square flat pin-free packaging structure of the power module according to this invention, there are height differences between the driving chip lead frame 3 and the power chip lead frames 2, such that tensions on the large-span metal leads increase, thereby preventing the collapse caused by the gravity and further reducing the occurrence of short-circuit on the entire module caused by the lead collapse. At the same time, there is provided a bonding island 5 as the bridging medium in the middle of over-long metal leads, so that an over-long metal lead may be converted into a group of multiple short leads. Since the shorter bonding wire may offset the gravity with its own tension, the occurrence of short-circuit of the entire module caused by the lead collapse may be reduced. In summary, the structure according to the invention simplifies the bonding process and effects a saving in manufacturing cost.

(3) It requires multiple discrete devices to achieve the same circuit function as the power module according to this invention, and the specified packaging space may not hold the required multiple discrete devices so that the circuit function can't be achieved with discrete devices. As a result, compared with the discrete devices, a smaller size power module of this invention may relatively easily achieve the circuit function, offering a cost advantage. Furthermore, in the power module of this invention, multiple chips are packaged into the module and any unwanted connection resistance or inductance is eliminated, which increasing the integration density and reducing the parasitic and power losses.

Figure 1:
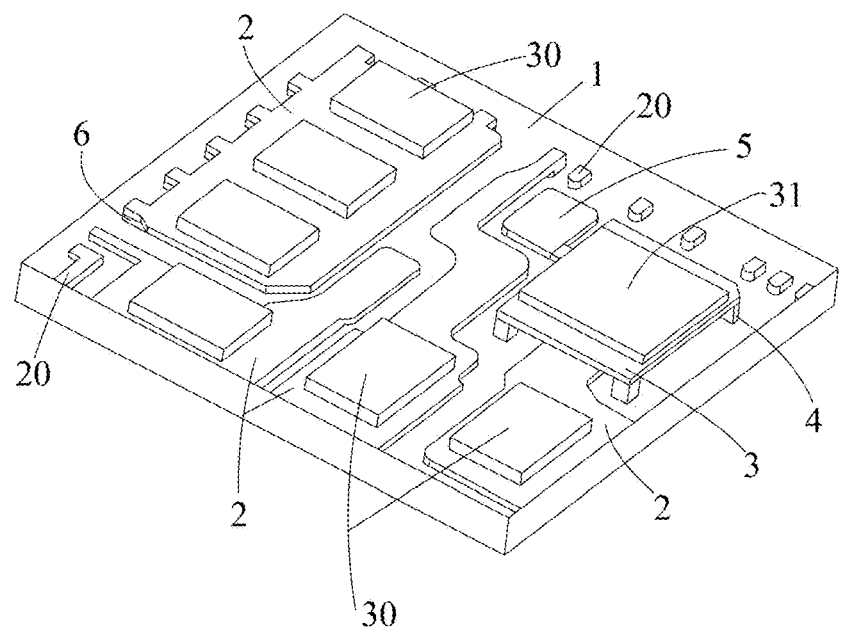
FIG. 1 is a three-dimension view of an embodiment of the square flat pin-free packaging structure of the power module according to the invention, in which leads are not shown.

In which, 1. Insulating resin; 2. Power chip lead frame; 3. Driving chip lead frame; 4. Metal supporting pillar; 5. Bonding island; 6. Metal heat dissipating disk; 7. Conductive solder; 8. Silver paste; 9. Tape; 20. Metal electrode contact; 30. Power chip; 31. Driving chip; 101. Copper lead; 102. gold lead.

DETAILED DESCRIPTION OF THE INVENTION

A power module of a square flat pin-free packaging structure comprises: insulating resin 1, a driving chip 31, power chips 30, and metal electrode contacts 20, the driving chip 31, the power chips 30, and the metal electrode contacts 20 are electrically connected through a metal lead according to a specified design circuit, metal heat dissipating disks 6 used for heat dissipation of the power chips and a driving chip lead frame 3 are disposed at the bottom of the insulating resin 1, power chip lead frames 2 are disposed on the metal heat dissipating disks 6, the power chips 30 are disposed on the power chip lead frames 2, and the drain electrodes of the power chips 30 are electrically connected to the metal heat dissipating disks 6, the driving chips 31 are disposed on the driving chip lead frames 3, and the metal heat dissipating disks 6 extend beyond the area occupied by the driving chip lead frame 3 and the metal electrode contacts 20 at the bottom layer to cover other bottom areas than those occupied by the driving chip lead frame 3 and the metal electrode contacts 20, metal supporting pillars 4 are disposed on the bottom layer below the driving chip lead frame 3 and used to elevate the driving chip lead frame 3 away from the bottom layer, and the metal heat dissipating disks 6 further extend into the bottom layer area below the driving chip lead frame 3. In this embodiment, a bonding island 5 is disposed on the bottom layer, which acts as a bridging point of the metal leads connecting to the driving chip 31 and the power chips 30 to effect the connection between the driving chip 31 and the power chips 30.

In order to make the object, technical solution and merits of the present invention clearer, the present invention will be illustrated in detail by way of a preferred example in conjunction with the accompanying figures.

Figure 2:
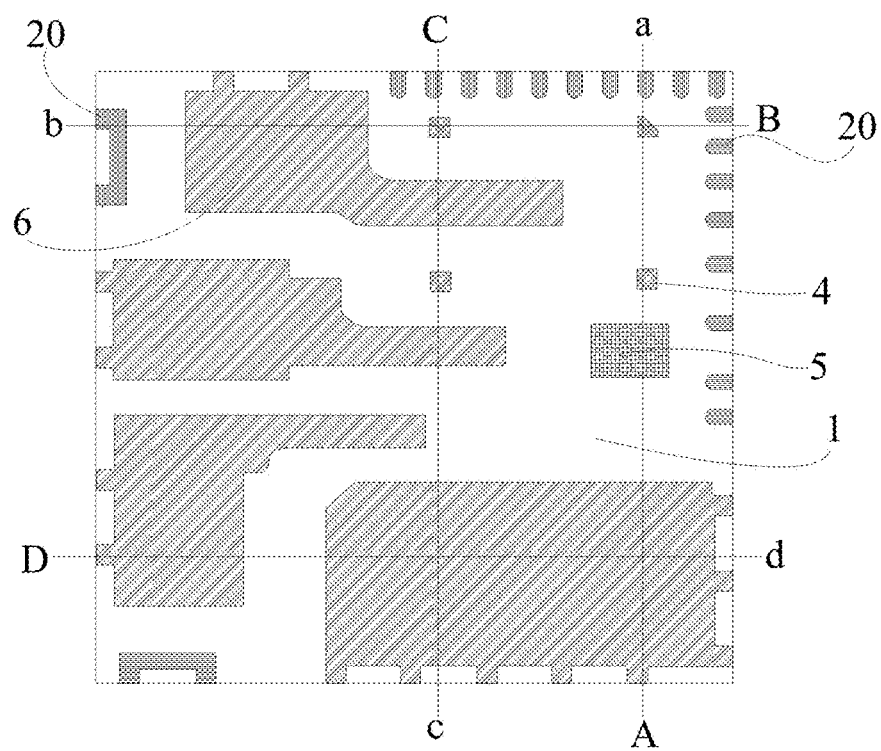
FIG. 2 is a schematic top view of the embodiment of the square flat pin-free packaging structure of the power module according to the invention.
Figure 3:
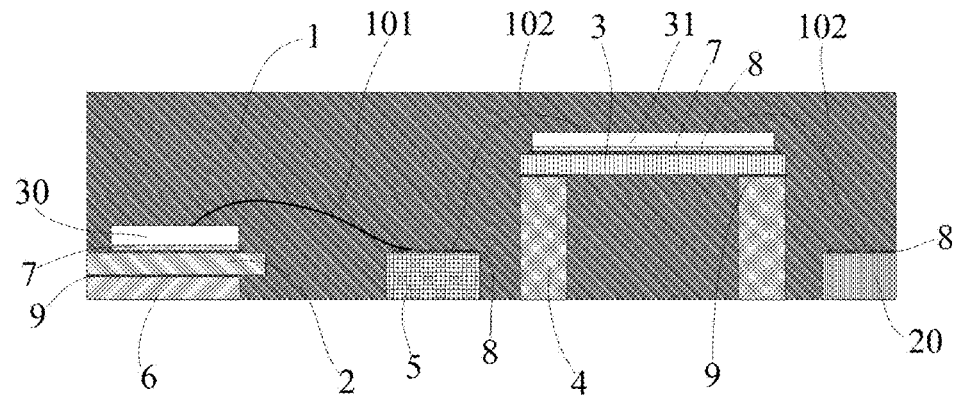
FIG. 3 is a sectional view of the embodiment of the square flat pin-free packaging structure of the power module according to the invention, which is taken along line A-a of FIG. 2.
Figure 4:
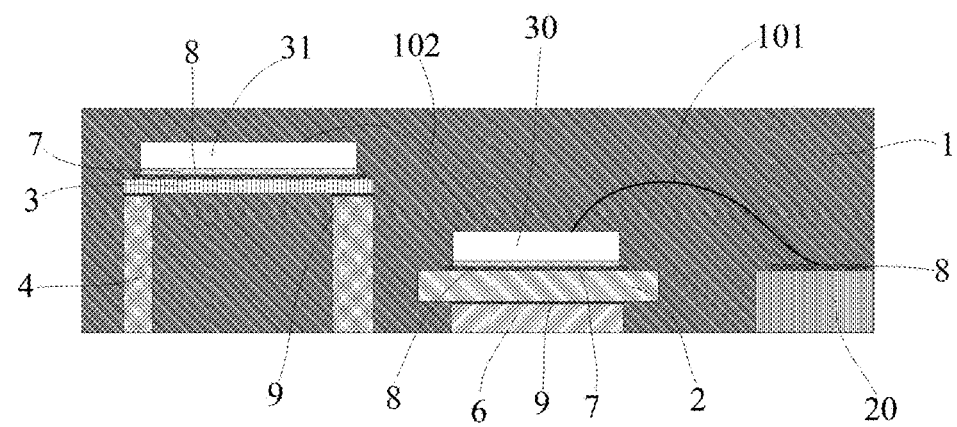
FIG. 4 is a sectional view of the embodiment of the square flat pin-free packaging structure of the power module according to the invention, which is taken along line B-b of FIG. 2.
Figure 5:
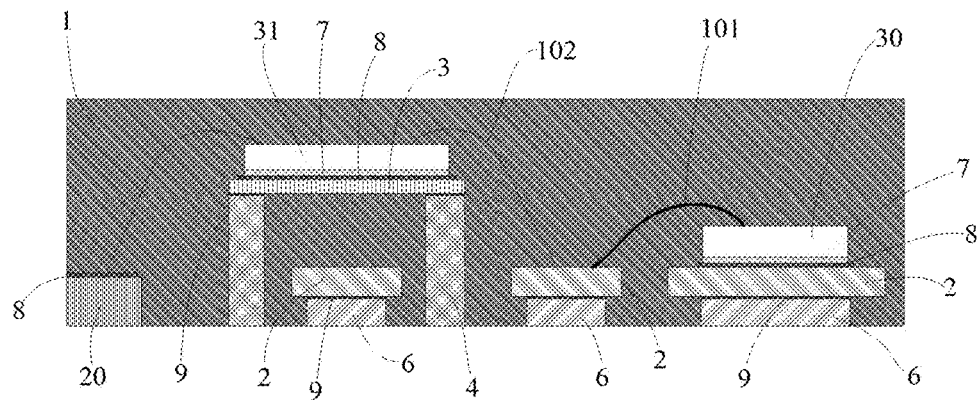
FIG. 5 is a sectional view of the embodiment of the square flat pin-free packaging structure of the power module according to the invention, which is taken along line C-c of FIG. 2.
Figure 6:
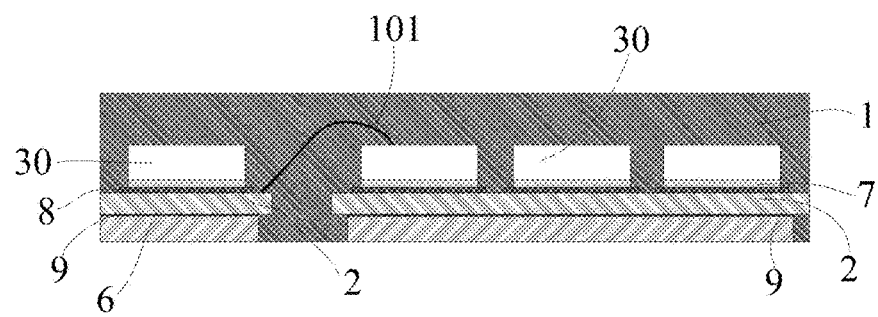
FIG. 6 is a sectional view of the embodiment of the square flat pin-free packaging structure of the power module according to the invention, which is taken along line D-d of FIG. 2.
Figure 7:
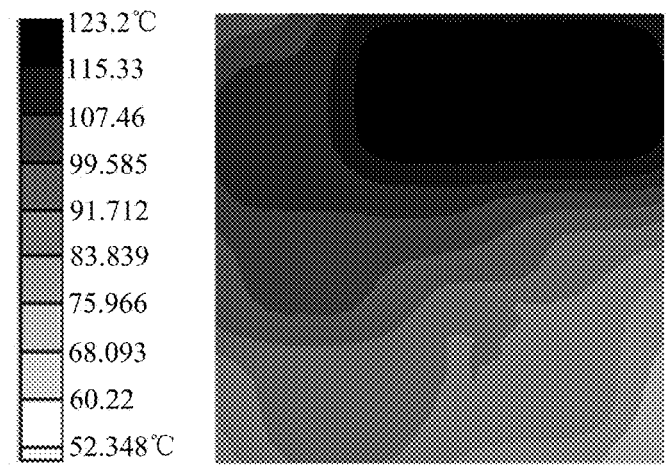
FIG. 7 is a thermal analysis diagram of the heat dissipation of a powered power module of the inventive structure at an ambient temperature of 20° C.
Figure 8:
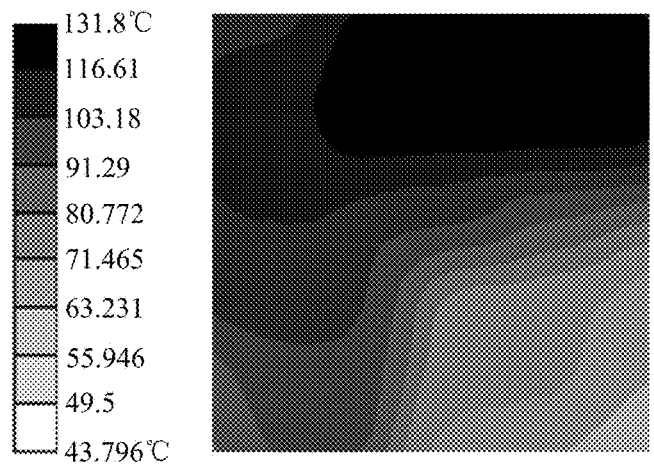
FIG. 8 is a thermal analysis diagram of the heat dissipation of a power module of the prior art structure at an ambient temperature of 20° C., with the same power as that of FIG. 7 being applied.

FIG. 1 is a three-dimension view of an embodiment of the square flat pin-free packaging structure of the power module according to the invention, in which leads are not shown; FIG. 2 is a schematic top view of the embodiment of the square flat pin-free packaging structure of the power module according to the invention; FIG. 3 is a sectional view of the embodiment of the square flat pin-free packaging structure of the power module, which is taken along line A-a of FIG. 2; FIG. 4 is a sectional view of the embodiment of the square flat pin-free packaging structure of the power module, which is taken along line B-b of FIG. 2; FIG. 5 is a sectional view of the embodiment of the square flat pin-free packaging structure of the power module, which is taken along line C-c of FIG. 2; FIG. 6 is a sectional view of the embodiment of the square flat pin-free packaging structure of the power module, which is taken along line D-d of FIG. 2; FIG. 7 and FIG. 8 are respectively the thermal analysis diagrams of the heat dissipation of the power module of the inventive structure and the power module of the prior art structure at an ambient temperature of 20° C., with the same power being applied.

As shown in FIGS. 1 to 6, a square flat pin-free packaging structure of a power module comprises: large size bare metal heat dissipating disks 6 disposed at the bottom of the packaged module; metal electrode contacts 20 disposed peripherally, which function as pins; power chip lead frames 2; a driving chip lead frame 3 and metal supporting pillars 4 for elevating the driving chip lead frame 3; conductive solder 7 and silver paste 8 which enable the interconnection between the driving chip 31 and the driving chip lead frame 3 and the interconnection between the power chip 30 and the power chip lead frame 2; a bonding island 5 acting as a bridging point for leads; multiple metal wires for electric connection: copper leads 101 and gold leads 102; insulating resin 1 acting as the filler material for the packaging space.

As shown in FIGS. 3 to 6, the metal heat dissipating disks 6 are disposed below the power chip lead frames 2, connected to the power chip lead frames 2 via tapes 9 and smaller in size than the power chip lead frames 2; the power chips 30 are disposed on the power chip lead frames 2 with the conductive solder 7 and the silver paste 8 applied therebetween, in which the conductive solder 7 covers the bottom of the power chips 30, the silver paste 8 is plated directly on the top of the power chip lead frames 2, and the conductive solder 7 bonds directly to the silver paste 8.

As shown in FIGS. 1 to 5, the driving chip lead frame 3 is elevated by four metal supporting pillars 4 disposed under its corners, the driving chip lead frame 3 connects to the metal supporting pillars 4 by means of tapes 9; the driving chip 31 bonds to the top of the driving chip lead frame 3 via the conductive solder 7 and the silver paste 8, in which the conductive solder 7 covers the bottom of the driving chip, the silver paste 8 is plated directly on the top of the driving chip lead frame 3, and the conductive solder 7 bonds directly to the silver paste 8.

As shown in FIGS. 1 to 5, portions of the power chip lead frames 2 and the corresponding metal heat dissipating disks 6 extend into the area below the driving chip lead frame 3.

As shown in FIGS. 1 to 5, there is provided a bonding island 5, on top of which silver paste 8 is plated as well. Gold leads 102 are connected by wire-bonding between the driving chip 31 and the bonding island 5, the power chips 30, the metal electrode contacts 20 as well as the power chip lead frames 2; copper leads 101 are connected by wire-bonding between the power chips 30 and the bonding island 5, the metal electrode contacts 20 as well as the power chip lead frames 2.

FIGS. 7 and 8 illustrate the thermal analysis of the heat dissipation of the inventive structure and the prior art structure with the same power applied and in the same environment. As shown in FIG. 7, the highest temperature of the inventive structure is 123.2° C. and the lowest temperature is 53.348° C. As shown in FIG. 8, the highest temperature of the prior art structure is 131.8° C. and the lowest temperature is 43.796° C. It's obvious that the temperature differences between the areas of the module of the inventive structure as shown in FIG. 7 are smaller than those of the prior art module as shown in FIG. 8, demonstrating the inventive structure enabling a more uniform temperature distribution on the entire packaged power module, thereby inhibiting excessive local heat build-up. As shown in FIGS. 7 and 8, the high temperature area of the module of the inventive structure has a lower temperature than that of the power module of the prior art structure, demonstrating the module of the inventive structure as shown in FIG. 7 having a better heat dissipating efficiency than the power module as shown in FIG. 8.

This invention is not limited in application to the illustrated packaging structure of the power module which containing one driving chip and six power chips, but also suitable for the module package with multiple driving chips and multiple power chips.

Although the object, technical solution and merits of the invention have been explained in relation to its preferred embodiment(s) as mentioned above, it is to be understood that this description is not meant to be construed in a limiting sense. Those skilled in the art can make many other possible modifications, variations or equivalents to those embodiments without departing from the scope of the present invention. It is, therefore, contemplated that the claims will cover such modifications, variations or equivalents that fall within the true scope of the invention.

What is claimed is:

1. A power module of a square flat pin-free packaging structure, comprising: an insulating resin, a driving chip, a plurality of power chips, and a plurality of metal electrode contacts, wherein the driving chip, the plurality of power chips, and the plurality of metal electrode contacts are electrically connected through a metal lead according to a predetermined circuit, a plurality of metal heat dissipating disks used for heat dissipation for the plurality of power chips and a driving chip lead frame are disposed at a bottom of the insulating resin, wherein a plurality of power chip lead frames are disposed on the plurality of metal heat dissipating disks, wherein the plurality of power chips are disposed on the plurality of power chip lead frames, and a plurality of drain electrodes of the power chips are electrically connected to the plurality of metal heat dissipating disks, wherein the plurality of driving chips are disposed on the plurality of driving chip lead frames, wherein the plurality of metal heat dissipating disks extend beyond an area occupied by the driving chip lead frame and the plurality of metal electrode contacts at the bottom to cover the bottom areas not occupied by the driving chip lead frame and the plurality of metal electrode contacts, wherein a plurality of metal supporting pillars are disposed on a lower part of the driving chip lead frame, wherein the plurality of metal supporting pillars stand on the bottom and elevate the driving chip lead frame away from the bottom, and the plurality of metal heat dissipating disks further extend into a bottom layer area below the driving chip lead frame.

2. The power module of a square flat pin-free packaging structure according to claim 1, wherein a bonding island is disposed on the bottom to connect the plurality of metal leads connecting the driving chip and the plurality of power chips, wherein the bonding island acts as a bridge point to achieve the connection between the driving chip and the plurality of power chips.

* * * * *